United States Patent
Nayak

(10) Patent No.: US 8,018,360 B2
(45) Date of Patent: Sep. 13, 2011

(54) SYSTEMS AND METHODS FOR MITIGATING LATENCY IN A DATA DETECTOR FEEDBACK LOOP

(75) Inventor: Ratnakar Aravind Nayak, Longmont, CO (US)

(73) Assignee: Agere Systems Inc., Allentown, PA (US)

( * ) Notice: Subject to any disclaimer, the term of this patent is extended or adjusted under 35 U.S.C. 154(b) by 11 days.

(21) Appl. No.: 12/663,319

(22) PCT Filed: May 19, 2008

(86) PCT No.: PCT/US2008/064121
§ 371 (c)(1), (2), (4) Date: Dec. 7, 2009

(87) PCT Pub. No.: WO2009/142620
PCT Pub. Date: Nov. 26, 2009

(65) Prior Publication Data
US 2010/0164764 A1    Jul. 1, 2010

(51) Int. Cl.
*H03M 1/06* (2006.01)
(52) U.S. Cl. ......... 341/118; 341/117; 341/119; 341/120
(58) Field of Classification Search .......... 341/117–120, 341/155; 375/350, 229, 233; 360/51
See application file for complete search history.

(56) References Cited

U.S. PATENT DOCUMENTS

| | | |
|---|---|---|
| 5,278,846 A | 1/1994 | Okayama et al. |
| 5,325,402 A | 6/1994 | Ushirokawa |
| 5,392,299 A | 2/1995 | Rhines et al. |
| 5,513,192 A | 4/1996 | Janku et al. |
| 5,612,964 A | 3/1997 | Haraszti |
| 5,701,314 A | 12/1997 | Armstrong et al. |
| 5,717,706 A | 2/1998 | Ikeda |
| 5,802,118 A | 9/1998 | Bliss et al. |
| 5,844,945 A | 12/1998 | Nam et al. |
| 5,898,710 A | 4/1999 | Amrany |
| 5,923,713 A | 7/1999 | Hatakeyama |
| 5,978,414 A | 11/1999 | Nara |
| 5,983,383 A | 11/1999 | Wolf |
| 6,005,897 A | 12/1999 | McCallister et al. |

(Continued)

FOREIGN PATENT DOCUMENTS

WO    WO 2006/016751    2/2006

(Continued)

OTHER PUBLICATIONS

Collins and Hizlan, "Determinate State Convolutional Codes" IEEE Transactions on Communications, Dec, 1993.

(Continued)

*Primary Examiner* — Jean Jeanglaude
(74) *Attorney, Agent, or Firm* — Hamilton DeSanctis & Cha

(57) ABSTRACT

Methods and systems for mitigating latency in a data detector feedback loop are included. For example, a method for reducing latency in an error corrected data retrieval system is included. The method includes performing an analog to digital conversion at a sampling instant to create a digital sample, and performing a data detection on the digital sample to create a detected output. The detected output is compared with the digital sample to determine a phase error. During an interim period, the digital sample is adjusted to reflect the phase error to create an adjusted digital sample. After the interim period, the sampling instant is adjusted to reflect the phase error.

26 Claims, 5 Drawing Sheets

U.S. PATENT DOCUMENTS

| | | | |
|---|---|---|---|
| 6,023,783 | A | 2/2000 | Divsalar et al. |
| 6,029,264 | A | 2/2000 | Kobayashi et al. |
| 6,041,432 | A | 3/2000 | Ikeda |
| 6,097,764 | A | 8/2000 | McCallister et al. |
| 6,216,251 | B1 | 4/2001 | McGinn |
| 6,266,795 | B1 | 7/2001 | Wei |
| 6,317,472 | B1 | 11/2001 | Choi et al. |
| 6,351,832 | B1 | 2/2002 | Wei |
| 6,377,610 | B1 | 4/2002 | Hagenauer et al. |
| 6,438,717 | B1 | 8/2002 | Butler et al. |
| 6,473,878 | B1 | 10/2002 | Wei |
| 6,625,775 | B1 | 9/2003 | Kim |
| 6,671,404 | B1 | 12/2003 | Kawatani et al. |
| 6,748,034 | B2 | 6/2004 | Hattori et al. |
| 6,757,862 | B1 | 6/2004 | Marianetti |
| 6,788,654 | B1 | 9/2004 | Hashimoto et al. |
| 6,810,502 | B2 | 10/2004 | Eidson et al. |
| 6,986,098 | B2 | 1/2006 | Poeppelman et al. |
| 7,010,051 | B2 | 3/2006 | Murayama et al. |
| 7,047,474 | B2 | 5/2006 | Rhee et al. |
| 7,058,873 | B2 | 6/2006 | Song et al. |
| 7,093,179 | B2 | 8/2006 | Shea |
| 7,184,486 | B1 | 2/2007 | Wu et al. |
| 7,191,378 | B2 | 3/2007 | Eroz et al. |
| 7,203,887 | B2 | 4/2007 | Eroz et al. |
| 7,257,764 | B2 | 8/2007 | Suzuki et al. |
| 7,310,768 | B2 | 12/2007 | Eidson et al. |
| 2004/0071206 | A1 | 4/2004 | Takatsu |
| 2004/0098659 | A1 | 5/2004 | Bjerke et al. |
| 2005/0111540 | A1 | 5/2005 | Modrie et al. |
| 2005/0157780 | A1 | 7/2005 | Werner et al. |
| 2005/0216819 | A1 | 9/2005 | Chugg et al. |
| 2005/0273688 | A1 | 12/2005 | Argon |
| 2006/0020872 | A1 | 1/2006 | Richardson et al. |
| 2006/0031737 | A1 | 2/2006 | Chugg et al. |
| 2006/0140311 | A1 | 6/2006 | Ashley et al. |
| 2006/0168493 | A1 | 7/2006 | Song |
| 2006/0195772 | A1 | 8/2006 | Graef et al. |
| 2006/0210002 | A1* | 9/2006 | Yang et al. ............ 375/350 |
| 2006/0248435 | A1 | 11/2006 | Haratsch |
| 2007/0011569 | A1 | 1/2007 | Casado et al. |
| 2007/0047121 | A1* | 3/2007 | Eleftheriou et al. ........... 360/51 |
| 2007/0047635 | A1 | 3/2007 | Stojanovic et al. |
| 2007/0286270 | A1 | 12/2007 | Huang et al. |
| 2008/0049825 | A1 | 2/2008 | Chen et al. |
| 2008/0168330 | A1 | 7/2008 | Graef et al. |

FOREIGN PATENT DOCUMENTS

| | | |
|---|---|---|
| WO | WO 2006/091797 | 8/2007 |

OTHER PUBLICATIONS

Eleftheriou, E. et al., "Low Density Parity Check Codes for Digital Subscriber Lines", Proc ICC 2002, pp. 1752-1757.

Han and Ryan, "Pinning Techniques for Low-Floor Detection/Decoding of LDPC-Coded Partial Response Channels", 5th International Symposium on Turbo Codes &Related Topics, 2008.

Mohsenin et al., "Split Row: A Reduced Complexity, High Throughput LDPC Decoder Architecture", pp. 1-6, printed from www.ece.ucdavis.edu on Jul. 9, 2007.

Vasic, B., "High-Rate Low-Density Parity-Check Codes Based on Anti-Pasch Affine Geometries," Proc ICC 2002, pp. 1332-1336.

Vasic, B., "High-Rate Girth-Eight Codes on Rectangular Integer Lattices", IEEE Trans. Communications, vol. 52, Aug. 2004, pp. 1248-1252.

Yeo et al., "VLSI Architecture for Iterative Decoders in Magnetic Storage Channels", Mar. 2001, pp. 748-755, IEEE trans. Magnetics, vol. 37, No. 2.

Zhong et al., "Area-Efficient Min-Sum Decoder VLSI Architecture for High-Rate QC-LDPC Codes in Magnetic Recording", pp. 1-15, Submitted 2006, not yet published.

Zhong, "Block-LDPC: A Practical LDPC Coding System Design Approach", IEEE Trans. on Circuits, Regular Papers, vol. 5, No. 4, pp. 766-775, Apr. 2005.

Zhong et al., "Design of VLSI Implementation-Oriented LDPC Codes", IEEE, pp. 670-673, 2003.

Zhong et al., "High-Rate Quasi-Cyclic LDPC Codes for Magnetic Recording Channel with Low Error Floor", ISCAS, IEEE pp. 3546-3549, May 2006.

Zhong et al., "Iterative MAX-LOG-MAP and LDPC Detector/Decoder Hardware Implementation for Magnetic Read Channel", SRC TECHRON, pp. 1-4, Oct. 2005.

Zhong et al., "Joint Code-Encoder Design for LDPC Coding System VLSI Implementation", ISCAS, IEEE pp. 389-392, May 2004.

Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.

Zhong, "VLSI Architecture of LDPC Based Signal Detection and Coding System for Magnetic Recording Channel", Thesis, RPI, Troy, NY, pp. 1-95, May 2006.

Casado et al., Multiple-rate low-density parity-check codes with constant blocklength, IEEE Transations on Communications, Jan. 2009, vol. 57, pp. 75-83.

* cited by examiner

US 8,018,360 B2

SYSTEMS AND METHODS FOR MITIGATING LATENCY IN A DATA DETECTOR FEEDBACK LOOP

BACKGROUND OF THE INVENTION

The present inventions are related to systems and methods for transferring information, and more particularly to systems and methods for reducing the effects of latency in data detection processes.

Various products including hard disk drives typically utilize a read channel device that provides an ability to retrieve information from a medium in one format, and provide it to a recipient in a digital data format. Such read channel devices include an analog to digital converter along with a data detector circuit implemented such that data dependencies may be used to process received information. For example, the information provided from the data detector may be used to determine the sampling points of the analog to digital converter. Turning to FIG. 1, an exemplary read channel device 100 is depicted that utilizes previously detected information to control sampling processes related to later received information. Read channel device 100 receives an analog input 103 which is processed using a continuous time filter 105. A filtered output 107 is provided to an analog to digital converter 110 that converts analog input 103 to a digital input 115 that is filtered using a digital finite impulse response filter 120. A filtered digital output 122 is provided to a data detector 125 which processes filtered digital output 122 and provides decisions indicative of a data output 127. When the error rate is reasonably low, data output 127 reflects data originally provided to a storage medium from which data input 103 is derived.

In addition, filtered digital output 122 is provided to a delay element 160 that operates to delay digital filtered output 122 to reflect the delay incurred by passing through data detector 125. The output of delay element 160 is effectively a filtered version of the output of analog to digital converter 110. Output 127 from data detector 125 is provided to an equalization target filter 130. The output of equalization target filter 130 is effectively what the filtered output of analog to digital converter 110 would have been in the absence of channel imperfections. The difference from what you want to receive (i.e., the output of equalization target filter 130) and what you received (i.e., the output of delay block 160) is created using a summation circuit 135. The output of summation circuit 135 is an error signal 137. In addition, a slope detection circuit 140 receives output 127 and determines a slope signal 142. A timing error detector circuit 145 combines slope signal 142 and error signal 137 to calculate a phase error adjustment which is reflected in a timing error signal 147. Timing error signal 147 is filtered by a loop filter 150 and the filtered value is provided to a phase mixer circuit 155. Phase mixer circuit 155 receives the output of loop filter 150 and provides a signal that controls the sampling phase of analog to digital converter 110.

The feedback of information from data detector 125 to analog to digital converter 110 provides for more accurate data detection processes, but the feedback loop incurs some level of latency. As the density of storage applications continues to increase, there is a potential that the latency incurred due to the feedback loop may become significant and may reduce the error rate performance of a read channel device. Further, feedback loop latency may become a gating factor to developing storage applications with increased data density and/or lower signal to noise ratios.

Hence, for at least the aforementioned reasons, there exists a need in the art for advanced systems and methods for performing data detection processes.

BRIEF SUMMARY OF THE INVENTION

The present inventions are related to systems and methods for transferring information, and more particularly to systems and methods for reducing the effects of latency in data detection processes.

Various embodiments of the present invention provide data retrieval systems. Such data retrieval systems include an analog to digital converter, a data detector, an error determination circuit, a first feedback loop and a second feedback loop. The analog to digital converter is operable to receive an analog signal and to provide a first digital signal corresponding to the analog signal at a first sampling instant. The data detector is operable to perform a data detection process on the first digital signal to provide a modified data signal, and the error determination circuit is operable to compare the modified data signal with a derivative of the first digital signal to determine a first error indication. The first feedback loop receives the first error indication and causes the analog to digital converter to provide a second digital signal corresponding to the analog signal at a second sampling instant. The second sampling instant is adjusted to reflect the first error indication. The second feedback loop receives the first error indication and adjusts the derivative of the first digital signal such that the error determination circuit determines a second error indication based at least in part on the adjusted derivative of the first digital signal.

In some instances of the aforementioned embodiments, the second feedback loop includes an interpolator that interpolates the first digital signal to generate the derivative of the first digital signal such that it compensates for the first error indication during an interim period. In some cases, the second feedback loop further includes a summation element and a delay element. The summation element and the delay element both receive the first error indication, and the summation element is operable to subtract the first error indication from a delayed version of the first error indication. In such cases, the output of the summation element is used to govern the amount of time interpolated by the interpolator. The delay applied by the delay element corresponds to a time period required for the first error indication to be reflected in the first feedback loop. This time period may be the interim period. By using the delay, the derivative of the first digital signal corresponds to the second digital signal after the interim period. Thus, an interim correction signal is used for a time period from when the first error indication is available until the second digital signal is available.

In various instances of the aforementioned embodiments, the error determination circuit includes an equalization target filter that equalizes the modified data signal. In such instances, the error determination circuit includes a summation element that provides a difference between the derivative of the first digital signal and the equalized modified data signal. The first error indication corresponds to the difference. In other instances of the aforementioned embodiments, the error determination circuit includes an equalization target filter that equalizes the modified data signal. The error determination circuit further includes a summation element and slope detection circuit. The summation element provides a difference between the derivative of the first digital signal and the equalized modified data signal, and the slope detection circuit determines a slope signal based at least in part on the modified data signal. The error determination circuit further includes a timing error detection circuit that generates the first error indication based at least in part on the difference and the slope signal. In yet other instances of the aforementioned embodiments, the first error indication includes a phase error indication and a frequency error indication. In such instances, a sum of the phase error indication and the frequency error indication may be used as the first error indication in the first feedback loop, and the phase error indication may be used as the first error indication in the second feedback loop.

Other embodiments of the present invention provide methods for reducing latency in an error corrected data retrieval system. The methods include performing an analog to digital conversion at a sampling instant to create a digital sample, and performing a data detection on the digital sample to create a detected output. The detected output is compared with the digital sample to determine a phase error. During an interim period, the digital sample is adjusted to reflect the phase error to create an adjusted digital sample. After the interim period, the sampling instant is adjusted to reflect the phase error.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for transferring information, and more particularly to systems and methods for reducing the effects of latency in data detection processes.

Various embodiments of the present invention provide for latency reduction in the application of error correction feedback information in a data retrieval system. The latency reduction is accomplished through use of an interim feedback loop that allows for an interim incorporation of error correction feedback information, while not necessarily interfering with an outer error correction feedback loop. In some instances of the aforementioned embodiments, the data retrieval system is a read channel device designed to reconstruct information received from a storage medium or a data transfer channel. Based on the disclosure provided herein, one of ordinary skill in the art will recognize a variety of data retrieval and other systems that may be advantaged through incorporation of an error correction system including an interim feedback loop in accordance with embodiments of the present invention.

In some embodiments of the present invention, a timing loop is used to detect data imbedded in an incoming analog signal. The timing loop includes an analog to digital converter, a data detector, and a outer error feedback loop. In addition, the timing loop includes an interim feedback loop that allows for using error correction information before it would otherwise be available after passing through a outer error feedback path. The interim feedback loop includes a signal interpolator that allows for predicting a signal that will be available from the outer error feedback loop once the error correction information has been fully processed. Once the error correction has been fully processed and accounted for in the outer feedback loop, the interim feedback loop negates any prior correction based on the error. Such embodiments of the present invention provide reduced latency in incorporating error correction information in future computations. Such a reduction in error correction latency allows for increased loop stability and a corresponding reduction in bit error rate. Further, by allowing error correction information to be processed via the outer feedback loop, sampling by an analog to digital converter receiving the analog input signal can be adjusted at a later time without requiring the latency incurred by a outer feedback loop.

Figure 1:
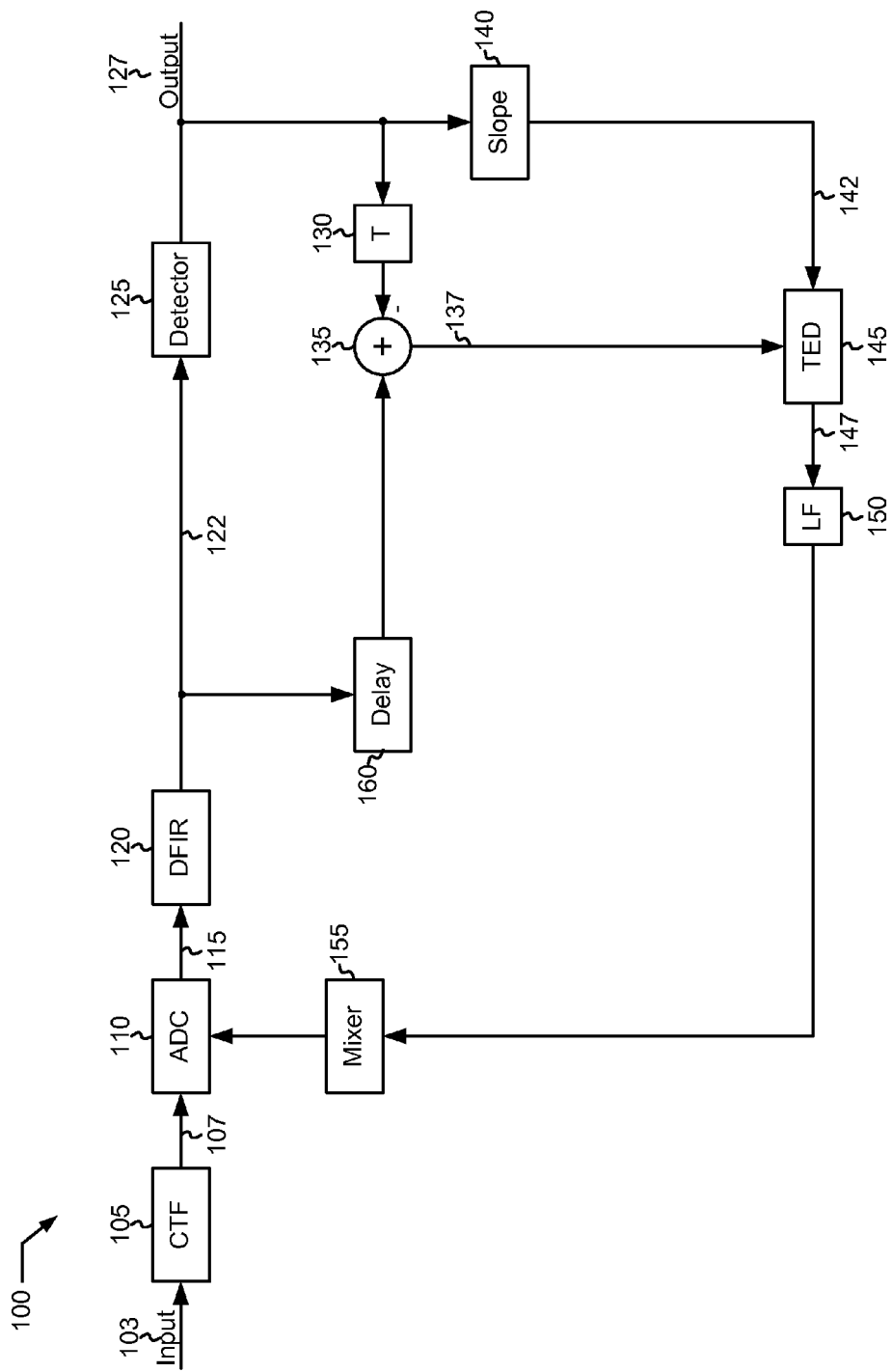
FIG. 1 depicts a prior art read channel device.
Figure 2:
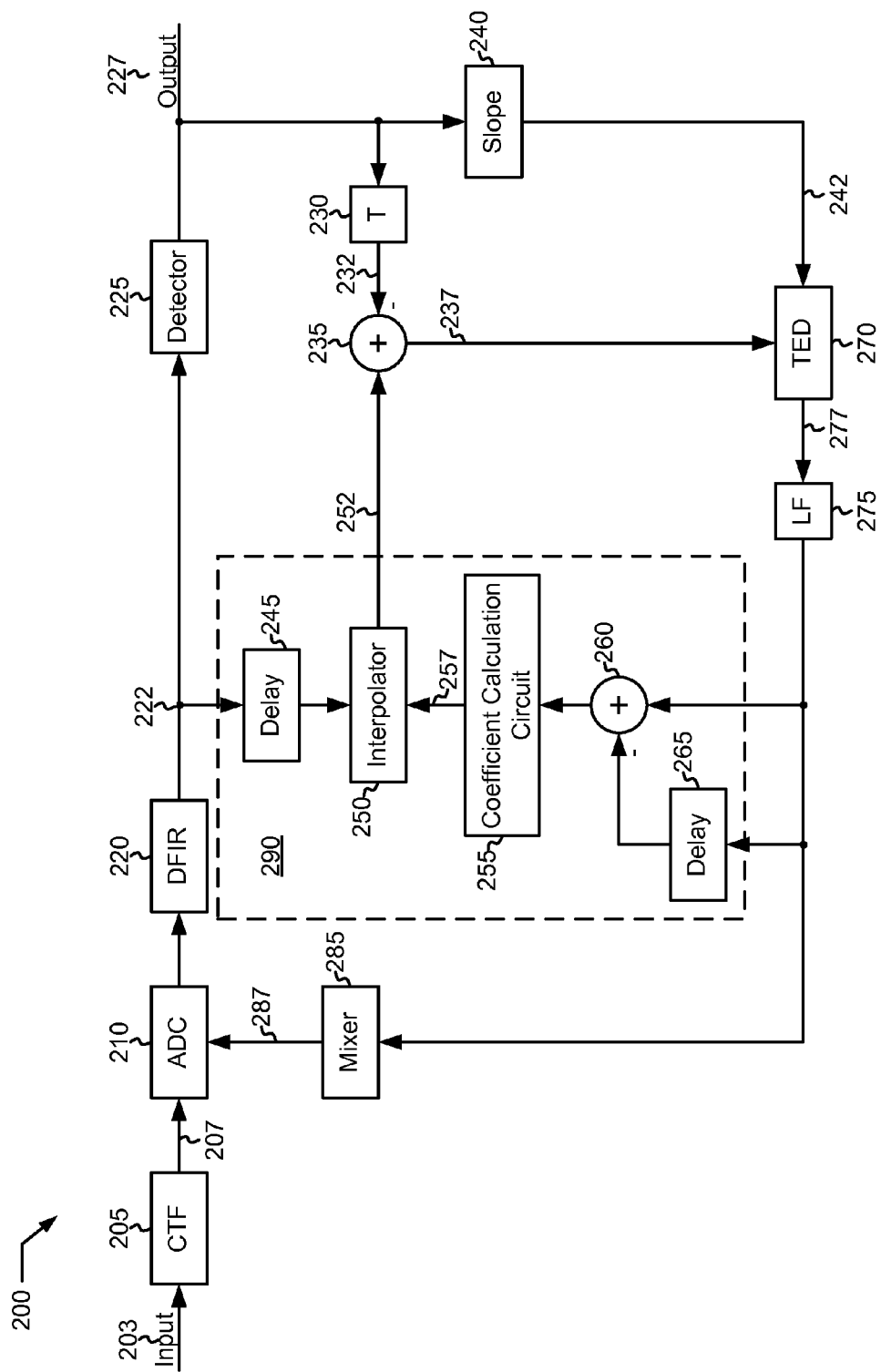
FIG. 2 depicts a data retrieval device including error feedback latency reduction in accordance with various embodiments of the present invention.

Turning to FIG. 2, a data retrieval device 200 including error feedback latency reduction is shown in accordance with various embodiments of the present invention. Data retrieval device 200 receives an input 203. Input 203 may be any analog data signal that carries information that may be converted from an analog signal domain to a digital signal domain. In some implementations of the present invention, input 203 may be derived from a magnetic storage medium and is an analog representation of data that was previously written to the magnetic storage medium. Alternatively, input 203 may be derived from a channel, such as, for example, a wireless data transmission channel and is an analog representation of data that was previously transmitted via the channel. Based on the disclosure provided herein, one of ordinary skill in the art will recognize a variety of input signals that may be processed using data retrieval devices in accordance with embodiments of the present invention. Input 203 is provided to a continuous time filter 205 that provides a filtered output 207 to an analog to digital converter 210. Continuous time filter 205 may be any continuous time filter known in the art, or may be replaced with some other filter capable of preparing input 203 for sampling by analog to digital converter 210. Based on the disclosure provided herein, one of ordinary skill in the art will recognize a variety of filters that may be used to prepare input 203 for sampling by analog to digital converter 210. Analog to digital converter 210 may be any circuit capable of converting an analog electrical signal into a digital representation thereof. Thus, for example, analog to digital converter 210 may be, but is not limited to, a static range, flash analog to digital converter or a dynamic range analog to digital converter as are known in the art. Based on the disclosure provided herein, one of ordinary skill in the art will recognize a variety of analog to digital converters that may be used in relation to different embodiments of the present invention.

Analog to digital converter 210 converts filtered output 207 to a digital input 215. Digital input 215 is filtered by a digital finite impulse response (DFIR) filter 220 as are known in the art. Digital finite impulse response filter 220 provides a filtered digital output 222 to a data detector 225. Data detector 225 may be any detector known in the art that is capable of receiving a potentially corrupted data stream and correcting one or more errors in the data stream. Thus, data detector 225 may be, but is not limited to, a Viterbi data detector capable of providing both soft and hard outputs, a maximum a posteriori data detector capable of providing both soft and hard outputs. Based on the disclosure provided herein, one of ordinary skill in the art will recognize a variety of data detectors that may be used in relation to embodiments of the present invention. Data detector 225 operates to detect and correct errors in filtered digital output 222 when compared with the original data from which input 203 is derived. Data detector 225 ultimately provides an output 227 representing the original data from which input 203 is derived. Said another way, where data detector 225 resolved any errors in filtered digital input 225, data output 227 represents what should have been received from analog to digital converter 210. This is in contrast to filtered digital output 222 which represents what was actually received from analog to digital converter 210.

Output 227 is used to adjust the timing of various sampling processes and detection processes performed in data retrieval device 200. In particular, output 227 is provided to an equalization target filter 230 that provides a reconstructed output 232 to a summation circuit 235. Reconstructed output 232 is output 227 after elimination of inter-symbol interference. Said another way, output 232 is effectively what would be expected from data detector 225 (i.e., reconstructed data samples), except for any signal corruption unresolved by data detector 225. Signal corruption may be due to electronic noise, defective media from which input 203 is derived, or the like. Equalization target filter 230 may be any equalization filter known in the art, and based on the disclosure provided herein, one of ordinary skill in the art will recognize a variety of equalization filters that may be used in relation to embodiments of the present invention. In addition, output 227 is provided to a slope detection circuit 240 that determines a slope signal 242 associated with a given output 227 as is known in the art. Slope signal 242 indicates where a given output 227 exists on a sinusoidal waveform from which it was derived. Slope signal 242 exhibits a maximum at a zero crossing of the sinusoidal signal, and at the maximums and minimums of the sinusoidal signal, slope signal 242 is a minimum. Slope signal 242 is used to indicate how much credibility can be given to an error signal 237. Filtered digital output 222 is also provided to a delay element 245 that causes application of a delay that reflects the delay through data detector 225 and the delay through equalization target filter 230 less a delay through a signal interpolator 250 as set forth in the following equation:

$$Delay_{245} = Delay_{225} + Delay_{230} - Delay_{250}.$$

In this way, the interpolated version of filtered digital output 222 (i.e., an interpolated output 252) is aligned in time with the corresponding output 227 after passing through equalization target filter 230.

An output of delay element 245 represents what was received from analog to digital converter 210, and interpolated output 252 provided by signal interpolator 250 represents what was received from analog to digital converter 210 phase shifted based on output 227. The output from signal interpolator 250 is provided to summation element 235 where a difference between it and an output of equalization target filter 230 is generated. The difference between the output of equalization target filter 230 and that of signal interpolator 250 is an error signal 237. Error signal 237 and slope signal 242 are provided to a timing error detector circuit 270 that combines error signal 237 and slope signal 242 to calculate a phase error adjustment which is reflected in a timing error signal 277. Timing error signal 277 is filtered by a loop filter 275 and the filtered value is provided to a phase mixer circuit 285. Phase mixer circuit 285 receives the output of loop filter 275 and provides a feedback signal 287 that controls the sampling phase of analog to digital converter 210 (i.e., ADC sampling instants). In this way, data retrieval device 200 is able to adjust the sampling phase of analog to digital converter 210 based directly on timing error signal 277 to minimize the energy in the error terms.

To reduce the latency involved in correcting output 227 based on timing error signal 277 via the aforementioned feedback loop passing information back to analog to digital converter 210, an interim feedback loop 290 (shown in dashed lines) is implemented. Interim feedback loop 290 provides an ability to get phase corrected information prepared and incorporated into timing error signal 277 faster than pre-existing approaches where correction information is not available until it is incorporated into the sampling phase of analog to digital converter 210. In operation, interim feedback loop 290 receives timing error signal 277 at a summation element 260. The output from summation element 260 is provided to a coefficient calculation circuit 255. Coefficient calculation circuit 255 provides a coefficient set 257 to signal interpolator 250. Coefficient set 257 is used by signal interpolator 250 to phase shift filtered digital input 222 by an amount corresponding to timing error signal 277. In this way, error signal 237 can be adjusted more quickly based on a previously generated timing error signal 277. In some embodiments of the present invention, signal interpolator 250 is a digital finite impulse response (DFIR) filter, and coefficient set 257 is a set of taps driving the digital filter. In some instances, calculation of coefficient set 257 is done through a lookup table using a derivative of the output of summation element 260 to address the lookup table. In other instances, coefficient calculation circuit 255 directly calculates coefficient set 257 based on the output of summation element 260. In some cases, interim feedback loop 290 may be considered a master loop (i.e., the loop from signal interpolator 250 through timing error detector circuit 270 and back to signal interpolator 250), and the outer error correction feedback loop may be considered a slave loop (i.e., the loop from analog to digital converter 210, through data detector 225, through timing error detect circuit 270, and back to analog to digital converter 210).

Eventually, the error corrected via interim feedback loop 290 is reflected in the output of analog to digital converter 210. Thus, timing error signal 277 is delayed via a delay element 265, and the output of delay element 265 is subtracted from the non-delayed timing error signal by summation element 260. The delay imposed by delay element 265 reflects the time required for timing error signal 277 to be translated for use by analog to digital converter 210 and for the output of analog to digital converter 210 to be translated into filtered digital signal 222 as set forth in the following equation:

$$Delay_{265} = Delay_{235} + Delay_{210} + Delay_{220} + Delay_{245}.$$

In this way, an error correction introduced via interim feedback loop 290, is negated when that same error correction finally propagates through phase mixer circuit 285, analog to digital converter 210, and DFIR 220. By negating the error signal when it is ultimately reflected back through the slave loop, the error indicated in timing error signal 277 is not double counted.

Based on the disclosure provided herein, one of ordinary skill in the art will recognize a variety of advantages that may be had through implementations of data retrieval systems incorporating interim error feedback in accordance with different embodiments of the present invention. For example, loop stability can be increased by the feedback latency reduction offered by the interim feedback loop, while maintaining the slave loop ensures that the sampling instants of analog to digital converter 210 are optimized.

Figure 3:
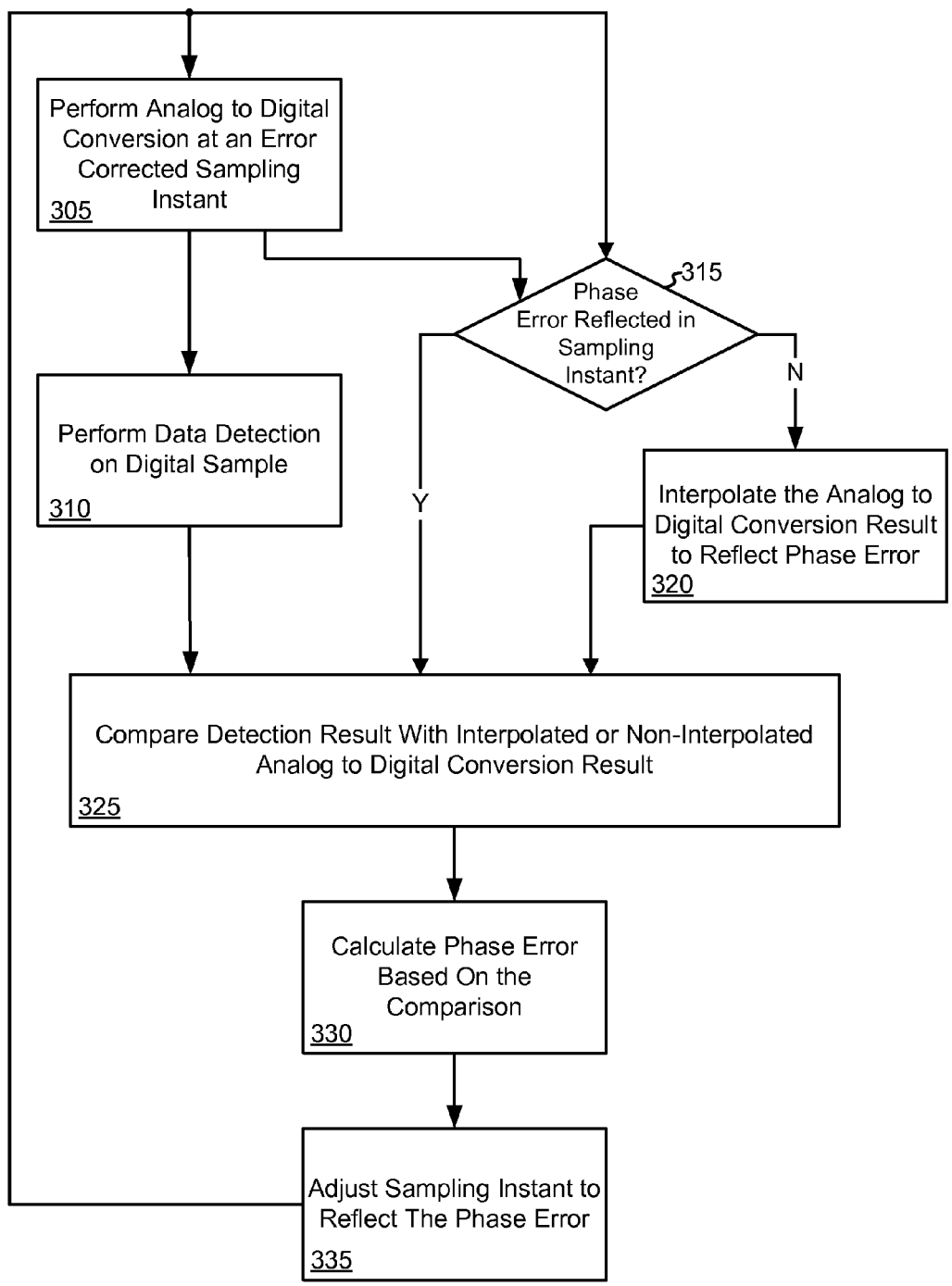
FIG. 3 is a flow diagram depicting a method for reduced latency error correction in accordance with some embodiments of the present invention.

Turning to FIG. 3, a flow diagram 300 depicts a method for reduced latency error correction in accordance with some embodiments of the present invention. Following flow diagram 300, an analog to digital conversion is performed on a received analog signal (block 305). This process results in a digital output corresponding to the analog to digital signal at a given sampling instant. The digital output is provided to a data detector where a data detection process is performed (block 310). The output of the data detector represents the output of the analog to digital converter after errors resulting from a corrupted input signal are reduced or eliminated. It is also determined whether a phase error determined in processing previous bits has already been reflected in the sampling instant driving the analog to digital conversion process (block 315). Where the phase error has already been incorporated in the sampling instant, the digital data derived from the analog to digital conversion process is compared with data derived from the data detection process (block 325). Alternatively, where the phase error has not already been incorporated in the sampling instant, the digital data derived from the analog to digital conversion process is interpolated (block 320). The interpolation updates the digital data output from the analog to digital conversion process to reflect the previously determined phase error. Where the phase error has not already been incorporated in the sampling instant, the interpolated digital data derived from the analog to digital conversion process is compared with data derived from the data detection process (block 325). In either case, the comparison (block 325) is used to calculate the phase error (block 330), and the phase error is used to adjust the sampling instant associated with the analog to digital conversion process (block 335). The currently calculated phase error is used in the interpolation processes (blocks 315-320) for an interim period until the currently calculated phase error is incorporated in the analog to digital conversion process (block 305).

Figure 4:
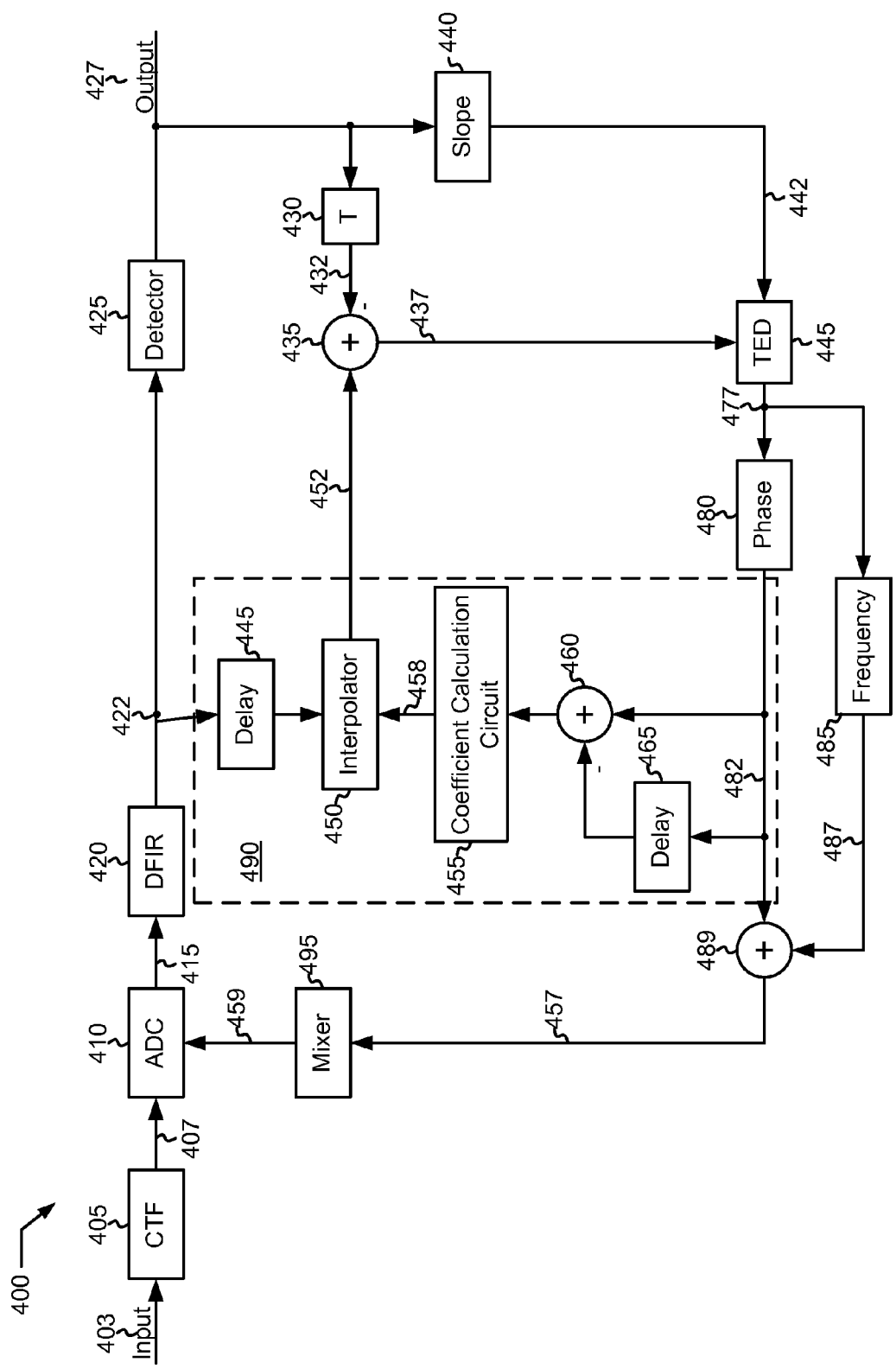
FIG. 4 depicts another data retrieval device including error feedback latency reduction in accordance with other embodiments of the present invention.

Turning to FIG. 4, a data retrieval device 400 including error feedback latency reduction is shown in accordance with other embodiments of the present invention. Of note, data retrieval device 400 is similar to data retrieval device 200, except that the construction of the error signal provided in the outer feedback path is different from that of the interim feedback path. Data retrieval device 400 receives an input 403 that may be any analog data signal that carries information that may be converted from an analog signal domain to a digital signal domain. In some implementations of the present invention, input 403 may be derived from a magnetic storage medium and is an analog representation of data that was previously written to the magnetic storage medium. Alternatively, input 403 may be derived from a channel, such as, for example, a wireless data transmission channel and is an analog representation of data that was previously transmitted via the channel. Based on the disclosure provided herein, one of ordinary skill in the art will recognize a variety of input signals that may be processed using data retrieval devices in accordance with embodiments of the present invention. Input 403 is provided to a continuous time filter 405 that provides a filtered output 407 to an analog to digital converter 410. Continuous time filter 405 may be any continuous time filter known in the art, or may be replaced with some other filter capable of preparing input 403 for sampling by analog to digital converter 410. Based on the disclosure provided herein, one of ordinary skill in the art will recognize a variety of filters that may be used to prepare input 403 for sampling by analog to digital converter 410. Analog to digital converter 410 may be any circuit capable of converting an analog electrical signal into a digital representation thereof. Thus, for example, analog to digital converter 410 may be, but is not limited to, a static range, flash analog to digital converter or a dynamic range analog to digital converter as are known in the art. Based on the disclosure provided herein, one of ordinary skill in the art will recognize a variety of analog to digital converters that may be used in relation to different embodiments of the present invention.

Analog to digital converter 410 converts filtered output 407 to a digital input 415. Digital input 415 is filtered by a digital finite impulse response (DFIR) filter 420 as are known in the art. Digital finite impulse response filter 420 provides a filtered digital output 422 to a data detector 425. Data detector 425 may be any detector known in the art that is capable of receiving a potentially corrupted data stream and correcting one or more errors in the data stream. Thus, data detector 425 may be, but is not limited to, a Viterbi data detector capable of providing both soft and hard outputs, a maximum a posteriori data detector capable of providing both soft and hard outputs. Based on the disclosure provided herein, one of ordinary skill in the art will recognize a variety of data detectors that may be used in relation to embodiments of the present invention. Data detector 425 operates to detect and correct errors in filtered digital output 422 when compared with the original data from which input 403 is derived. Data detector 425 ultimately provides an output 427 representing the original data from which input 403 is derived. Said another way, where data detector 425 resolved any errors in filtered digital input 425, data output 427 represents what should have been received from analog to digital converter 410. This is in contrast to filtered digital output 422 which represents what was actually received from analog to digital converter 410.

Output 427 is used to adjust the timing of various sampling processes and detection processes performed in data retrieval device 400. In particular, output 427 is provided to an equalization target filter 430 that provides a reconstructed output 432 to a summation circuit 435. Reconstructed output 432 is output 427 after elimination of inter-symbol interference. Said another way, output 432 is effectively what would be expected from data detector 425 (i.e., reconstructed data samples), except for any signal corruption unresolved by data detector 425. Signal corruption may be due to electronic noise, defective media from which input 403 is derived, or the like. Equalization target filter 430 may be any equalization filter known in the art, and based on the disclosure provided herein, one of ordinary skill in the art will recognize a variety of equalization filters that may be used in relation to embodiments of the present invention. In addition, output 427 is provided to a slope detection circuit 440 that determines a slope signal 442 associated with a given output 427 as is known in the art. Slope signal 442 indicates where a given output 427 exists on a sinusoidal waveform from which it was derived. Slope signal 442 exhibits a maximum at a zero crossing of the sinusoidal signal, and at the maximums and minimums of the sinusoidal signal, slope signal 442 is a minimum. Slope signal 442 is used to indicate how much credibility can be given to an error signal 437. Filtered digital output 422 is also provided to a delay element 445 that causes application of a delay that reflects the delay through data detector 425 and the delay through equalization target filter 430 less a delay through a signal interpolator 450 as set forth in the following equation:

$$Delay_{445}=Delay_{425}+Delay_{430}-Delay_{450}.$$

In this way, the interpolated version of filtered digital output 422 (i.e., an interpolated output 452) is aligned in time with the corresponding output 427 after passing through equalization target filter 430.

An output of delay element 445 represents what was received from analog to digital converter 410, and interpolated output 452 provided by signal interpolator 450 represents what was received from analog to digital converter 410 phase shifted based on output 427. The output from signal interpolator 450 is provided to summation element 435 where a difference between it and an output of equalization target filter 430 is generated. The difference between the output of equalization target filter 430 and that of signal interpolator 450 is an error signal 437. Error signal 437 and slope signal 442 are provided to a timing error detector circuit 470 that combines error signal 437 and slope signal 442 to calculate a phase error adjustment which is reflected in a timing error signal 477. Timing error signal 477 is provided to a phase correction circuit 480 and a frequency correction circuit 485. A phase error output 482 from phase correction circuit 480 is added to a frequency error output 487 from frequency correction circuit 485 using a summation circuit 489. A sum 457 of frequency error output 487 and phase error output 482 is provided to a phase mixer circuit 495. Phase mixer circuit 495 receives sum 457 and provides a feedback signal 459 that controls the sampling phase of analog to digital converter 410 (i.e., ADC sampling instants). In this way, data retrieval device 400 is able to adjust the sampling phase of analog to digital converter 410 based directly on timing error signal 477 to minimize the energy in the error terms.

To reduce the latency involved in correcting output 427 based on timing error signal 477 via the aforementioned feedback loop passing information back to analog to digital converter 410, an interim feedback loop 490 (shown in dashed lines) is implemented. Interim feedback loop 490 provides an ability to get phase corrected information prepared and incorporated into timing error signal 477 faster than pre-existing approaches where correction information is not available until it is incorporated into the sampling phase of analog to digital converter 410. In operation, interim feedback loop 490 receives timing error signal 477 via phase correction circuit 480 at a summation element 460. The output from summation element 460 is provided to a coefficient calculation circuit 455. Coefficient calculation circuit 455 provides a coefficient set 458 to signal interpolator 450. Coefficient set 458 is used by signal interpolator 450 to phase shift filtered digital input 422 by an amount corresponding to phase error output 482 that is derived from timing error signal 477. In this way, error signal 437 can be adjusted more quickly based on a previously generated timing error signal 477. In some embodiments of the present invention, signal interpolator 450 is a digital finite impulse response (DFIR) filter, and coefficient set 458 is a set of taps driving the digital filter. In some instances, calculation of coefficient set 458 is done through a lookup table using a derivative of the output of summation element 460 to address the lookup table. In other instances, coefficient calculation circuit 455 directly calculates coefficient set 458 based on the output of summation element 460. In some cases, interim feedback loop 490 may be considered a master loop (i.e., the loop from signal interpolator 450 through timing error detector circuit 470 and back to signal interpolator 450), and the outer error correction feedback loop may be considered a slave loop (i.e., the loop from analog to digital converter 410, through data detector 425, through timing error detect circuit 470, and back to analog to digital converter 410).

Eventually, the error corrected via interim feedback loop 490 is reflected in the output of analog to digital converter 410. Thus, phase error output 482 that is derived from timing error signal 477 is delayed via a delay element 465, and the output of delay element 465 is subtracted from the non-delayed timing error signal by summation element 460. The delay imposed by delay element 465 reflects the time required for timing error signal 477 to be translated for use by analog to digital converter 410 and for the output of analog to digital converter 410 to be translated into filtered digital signal 422 as set forth in the following equation:

$$Delay_{465}=Delay_{489}+Delay_{495}+Delay_{410}+Delay_{420}.$$

In this way, an error correction introduced via interim feedback loop 490, is negated when that same error correction finally propagates through phase mixer circuit 495, analog to digital converter 410, and DFIR 420. By negating the error signal when it is ultimately reflected back through the slave loop, the error indicated in timing error signal 477 is not double counted.

Error signal 477 includes information about various imperfections in phase shift filtered digital input 422 including the level of mis-equalization, phase error and frequency error. Timing error detector circuit 470 uses slope signal 442 and error signal 437 to estimate both the phase and frequency error terms that are included in timing error signal 477. Phase mixer circuit 495 uses both components to ensure that analog to digital converter 410 is producing optimally sampled digital data. Due to the different latencies of the slave loop as compared with the master loop, there may be a performance advantage that may be had where the frequency portion of error signal 477 is not utilized in the master loop. Thus, in some embodiments of the present invention, a steady-state interpolation phase at the interpolator is not used, and thus there is not a steady-state phase error at the input of data detector 425. As an example, if the incoming samples had a one percent (1%) frequency offset, the latency difference between the master loop and the slave loop was forty (40) samples, and the frequency estimate is fed to the master loop, a subtraction of a timing estimate 40 T (i.e., forty sample periods) in the past from the current timing estimate would be implemented due to the summation of summation element 460. This would lead to a phase of 40* 1%, or forty percent at signal interpolator 450. Because a digital phase lock loop circuit drives the energy in the error terms to be zero, the phase error at signal interpolator 450 is approximately zero. This means, the phase error at the input of signal interpolator 450 (and hence at the input of data detector 425) is forty percent, which may be detrimental to the performance of data detector 425.

Based on the disclosure provided herein, one of ordinary skill in the art will recognize a variety of advantages that may be had through implementations of data retrieval systems incorporating interim error feedback in accordance with different embodiments of the present invention. For example, loop stability can be increased by the feedback latency reduction offered by the interim feedback loop, while maintaining the slave loop ensures that the sampling instants of analog to digital converter 410 are optimized.

Figure 5:
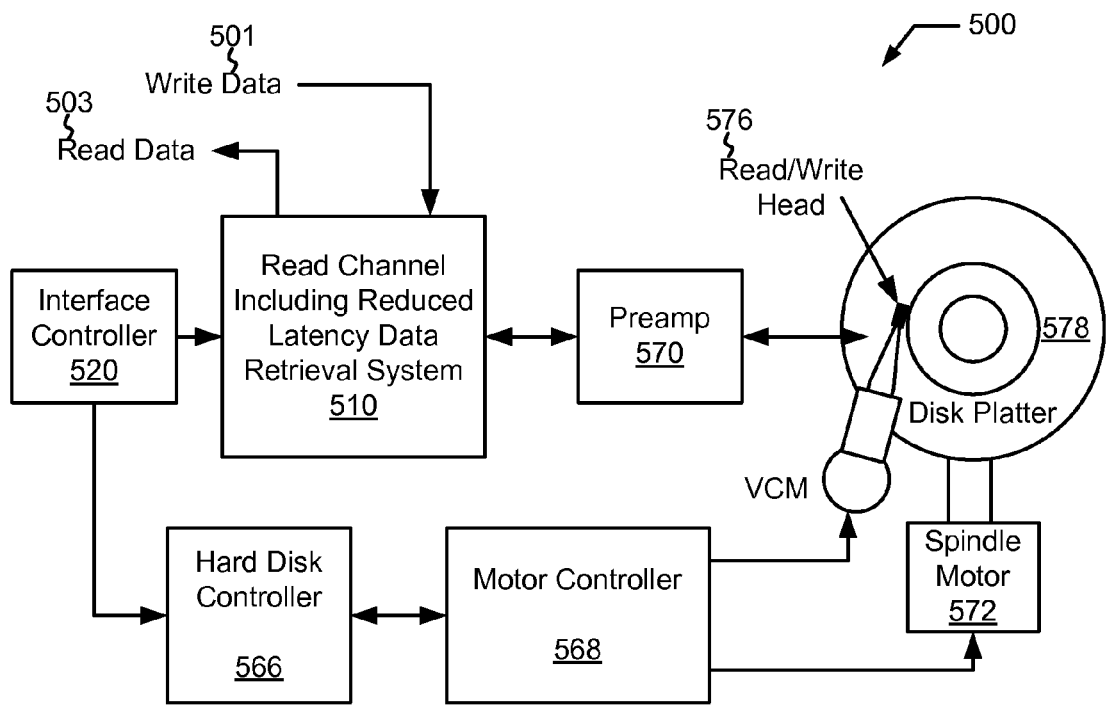
FIG. 5 depicts a storage system including a reduced latency data retrieval system in accordance with various embodiments of the present invention.

Turning to FIG. 5, a storage system 500 including a reduced latency data retrieval system is shown in accordance with various embodiments of the present invention. Storage system 500 may be, for example, a hard disk drive. Storage system 500 includes a read channel 510 with an incorporated reduced latency data retrieval system. The incorporated reduced latency data retrieval system may be any reduced latency data retrieval system that is capable of reducing latency in application of the error feedback. Thus, for example, the incorporated a reduced latency data retrieval system may be, but is not limited to, any of those described in relation to FIG. 2 and FIG. 4 above. In addition, storage system 500 includes an interface controller 520, a preamp 570, a hard disk controller 566, a motor controller 568, a spindle motor 572, a disk platter 578, and a read/write head 576. Interface controller 520 controls addressing and timing of data to/from disk platter 578. The data on disk platter 578 consists of groups of magnetic signals that may be detected by read/write head assembly 576 when the assembly is properly positioned over disk platter 578. In a typical read operation, read/write head assembly 576 is accurately positioned by motor controller 568 over a desired data track on disk platter 578. Motor controller 568 both positions read/write head assembly 576 in relation to disk platter 578 and drives spindle motor 572 by moving read/write head assembly to the proper data track on disk platter 578 under the direction of hard disk controller 566. Spindle motor 572 spins disk platter 578 at a determined spin rate (RPMs).

Once read/write head assembly 578 is positioned adjacent the proper data track, magnetic signals representing data on disk platter 578 are sensed by read/write head assembly 576 as disk platter 578 is rotated by spindle motor 572. The sensed magnetic signals are provided as a continuous, minute analog signal representative of the magnetic data on disk platter 578. This minute analog signal is transferred from read/write head assembly 576 to read channel module 564 via preamp 570. Preamp 570 is operable to amplify the minute analog signals accessed from disk platter 578. In addition, preamp 570 is operable to amplify data from read channel module 510 that is destined to be written to disk platter 578. In turn, read channel module 510 decodes and digitizes the received analog signal to recreate the information originally written to disk platter 578. This data is provided as read data 503 to a receiving circuit. A write operation is substantially the opposite of the preceding read operation with write data 501 being provided to read channel module 510. This data is then encoded and written to disk platter 578.

Figure 6:
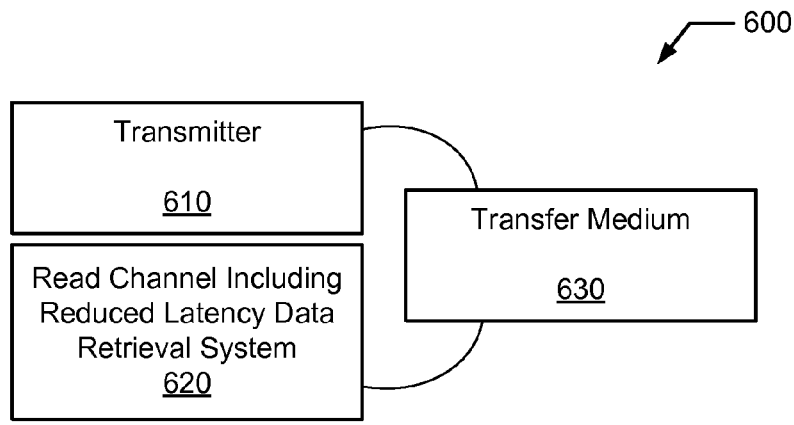
FIG. 6 depicts a communication system including a reduced latency data retrieval system in accordance with one or more embodiments of the present invention.

Turning to FIG. 6, a communication system 600 including a receiver 620 with a reduced latency data retrieval system in accordance with one or more embodiments of the present invention is shown. Communication system 600 includes a transmitter that is operable to transmit encoded information via a transfer medium 630 as is known in the art. The encoded data is received from transfer medium 630 by receiver 620. Receiver 620 incorporates a reduced latency data retrieval system. The incorporated reduced latency data retrieval system may be, but is not limited to, any of those described in relation to FIG. 2 and FIG. 4 above.

In conclusion, the invention provides novel systems, devices, methods and arrangements for mitigating latency in a data detector feedback loop. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data retrieval system, the circuit comprising:
an analog to digital converter, wherein the analog to digital converter is operable to receive an analog signal and to provide a first digital signal corresponding to the analog signal at a first sampling instant;
a data detector, wherein the data detector is operable to perform a data detection process on a derivative of the first digital signal to provide a modified data signal;
an error determination circuit, wherein the error determination circuit is operable to compare the modified data signal with the derivative of the first digital signal to determine a first error indication;
a first feedback loop, wherein the first feedback loop receives the first error indication and causes the analog to digital converter to provide a second digital signal corresponding to the analog signal at a second sampling instant, and wherein the second sampling instant is adjusted to reflect the first error indication; and
a second feedback loop, wherein the second feedback loop receives the first error indication and adjusts the derivative of the first digital signal such that the error determination circuit determines a second error indication based at least in part on the adjusted derivative of the first digital signal.

2. The system of claim 1, wherein the second feedback loop includes an interpolator that is operable to interpolate the first digital signal in time to compensate for the first error indication during an interim period, and wherein the interpolator provides the derivative of the first digital signal.

3. The system of claim 2, wherein the second feedback loop further includes a summation element and a delay element, wherein the summation element and the delay element both receive the first error indication, and wherein the summation element is operable to subtract the first error indication from a delayed version of the first error indication.

4. The system of claim 3, wherein the output of the summation element is used to govern the amount of time interpolated by the interpolator.

5. The system of claim 3, wherein the delay applied by the delay element corresponds to a time period required for the first error indication to be reflected in the first feedback loop.

6. The system of claim 2, wherein the derivative of the first digital signal corresponds to the second digital signal after the interim period.

7. The system of claim 3, wherein the interim period reflects the time period from when the first error indication is available, until the second digital signal is available.

8. The system of claim 1, wherein the error determination circuit includes an equalization target filter that equalizes the modified data signal, wherein the error determination circuit includes a summation element that provides a difference between the derivative of the first digital signal and the equalized modified data signal, and wherein first error indication corresponds to the difference.

9. The system of claim 1, wherein the error determination circuit includes an equalization target filter that equalizes the modified data signal, wherein the error determination circuit includes a summation element that provides a difference between the derivative of the first digital signal and the equalized modified data signal, wherein the error determination circuit includes a slope detection circuit that determines a slope signal based at least in part on the modified data signal, and wherein the error determination circuit includes a timing error detection circuit that generates the first error indication based at least in part on the difference and the slope signal.

10. The system of claim 1, wherein the first error indication includes a phase error indication and a frequency error indication, and wherein a sum of the phase error indication and the frequency error indication is used as the first error indication in the first feedback loop, and wherein on the phase error indication is used as the first error indication in the second feedback loop.

11. A method for reducing latency in an error corrected data retrieval system, the method comprising:
performing an analog to digital conversion at a sampling instant to create a digital sample;
performing a data detection on the digital sample to create a detected output;
comparing the detected output with the digital sample to determine a phase error;
during an interim period, adjusting the digital sample to reflect the phase error to create an adjusted digital sample; and
after the interim period, adjusting the sampling instant to reflect the phase error.

12. The method of claim 11, wherein the method further comprises:
receiving an analog input signal, wherein the analog input signal includes a data stream incorporated therein.

13. The method of claim 11, wherein comparing the detected output with the digital sample includes comparing the detected output with the adjusted digital sample during the interim period, and comparing the detected output directly with the digital sample after the interim period.

14. The method of claim 11, wherein the analog to digital conversion is a first analog to digital conversion, wherein the sampling instant is a first sampling instant, wherein the digital sample is a first digital sample, wherein adjusting the sampling instant to reflect the phase error provides a second sampling instant, wherein the data detection is a first data detection, wherein the detected output is a first detected output, wherein the phase error is a first phase error, wherein the interim period is a first interim period, wherein the adjusted digital sample is a first adjusted digital sample, and wherein the method further comprises:
performing a second analog to digital conversion at a second sampling instant to create a second digital sample;
performing a second data detection on the second digital sample to create a second detected output;
comparing the second detected output with the second digital sample to determine a second phase error;
during a second interim period, adjusting the second digital sample to reflect the second phase error to create a second adjusted digital sample; and
after the second interim period, adjusting the sampling instant to reflect the second phase error.

15. The method of claim 14, wherein the first interim period precedes the second interim period, and wherein a non-zero time period is disposed between the first interim period and the second interim period.

16. The method of claim 14, wherein comparing the second detected output with the second digital sample includes comparing the second detected output with the second adjusted digital sample during the second interim period, and comparing the second detected output directly with the second digital sample after the second interim period.

17. A data processing system, the data processing system comprising:
a data receiving device, wherein the data receiving device derives an analog signal from a medium, and wherein the data receiving device further includes:
an analog to digital converter, wherein the analog to digital converter is operable to receive the analog signal and to provide a first digital signal corresponding to the analog signal at a first sampling instant;
a data detector, wherein the data detector is operable to perform a data detection process on the first digital signal to provide a modified data signal;
an error determination circuit, wherein the error determination circuit is operable to compare the modified data signal with a derivative of the first digital signal to determine a first error indication;
a first feedback loop, wherein the first feedback loop receives the first error indication and causes the analog to digital converter to provide a second digital signal corresponding to the analog signal at a second sampling instant, and wherein the second sampling instant is adjusted to reflect the first error indication; and
a second feedback loop, wherein the second feedback loop receives the first error indication and adjusts the derivative of the first digital signal such that the error determination circuit determines a second error indication based at least in part on the adjusted derivative of the first digital signal.

18. The data processing system of claim 17, wherein the second feedback loop includes an interpolator, a summation element and a delay element; wherein the derivative of the first digital signal corresponds to the first digital signal interpolated in time to compensate for the first error indication during an interim period; wherein the summation element and the delay element both receive the first error indication, wherein the summation element is operable to subtract the first error indication from a delayed version of the first error indication; and wherein the output of the summation element is used to govern the amount of time interpolated by the interpolator.

19. The data processing system of claim 17, wherein the data receiving device is a wireless receiver, and wherein the medium is a wireless transmission medium.

20. The data processing system of claim 17, wherein the data processing system is a hard disk drive system, and wherein the medium is a magnetic storage medium.

21. The system of claim 1, wherein the system is included as part of an electronic device selected from a group consisting of: a data storage device, and a data transmission device.

22. The system of claim 1, wherein the system is included as part of a read channel circuit of a hard disk drive.

23. The system of claim 1, wherein the system is implemented as part of an integrated circuit.

24. The system of claim 17, wherein the system is included as part of an electronic device selected from a group consisting of: a data storage device, and a data transmission device.

25. The system of claim 17, wherein the system is included as part of a read channel circuit of a hard disk drive.

26. The system of claim 17, wherein the system is implemented as part of an integrated circuit.

* * * * *